(12) United States Patent
Kang et al.

(10) Patent No.: US 8,093,721 B2
(45) Date of Patent: Jan. 10, 2012

(54) FLIP CHIP SEMICONDUCTOR PACKAGE AND FABRICATION METHOD THEREOF

(75) Inventors: In-Soo Kang, Chungbuk (KR); Byung-Jin Park, Chungbuk (KR)

(73) Assignee: Nepes Corporation, Chungbuk (KR)

( * ) Notice: Subject to any disclaimer, the term of this patent is extended or adjusted under 35 U.S.C. 154(b) by 287 days.

(21) Appl. No.: 12/438,362

(22) PCT Filed: Aug. 31, 2007

(86) PCT No.: PCT/KR2007/004199
§ 371 (c)(1),
(2), (4) Date: Feb. 22, 2009

(87) PCT Pub. No.: WO2008/032944
PCT Pub. Date: Mar. 20, 2008

(65) Prior Publication Data
US 2010/0230810 A1    Sep. 16, 2010

(30) Foreign Application Priority Data
Sep. 11, 2006  (KR) .......................... 10-2006-0087464

(51) Int. Cl.
*H01L 23/48* (2006.01)
*H01L 23/52* (2006.01)
(52) U.S. Cl. ................. 257/737; 257/778; 257/E23.069
(58) Field of Classification Search .................. 257/737, 257/778, E23.069
See application file for complete search history.

(56) References Cited

U.S. PATENT DOCUMENTS

| | | | |
|---|---|---|---|
| 5,147,084 A * | 9/1992 | Behun et al. | 228/56.3 |
| 5,448,114 A * | 9/1995 | Kondoh et al. | 257/778 |
| 5,838,069 A * | 11/1998 | Itai et al. | 257/766 |
| 5,872,400 A * | 2/1999 | Chapman et al. | 257/738 |
| 5,889,326 A * | 3/1999 | Tanaka | 257/737 |
| 6,020,637 A | 2/2000 | Karnezos | |
| 6,225,695 B1 | 5/2001 | Chia et al. | |
| 6,459,144 B1 | 10/2002 | Pu et al. | |
| 6,614,113 B2 * | 9/2003 | Watanabe et al. | 257/750 |
| 6,661,087 B2 | 12/2003 | Wu | |
| 2002/0121692 A1 * | 9/2002 | Lee et al. | 257/737 |

* cited by examiner

*Primary Examiner* — Nitin Parekh

(57) ABSTRACT

There is provide a flip chip semiconductor package comprising: an electrode pad formed a semiconductor substrate; a lower metal bonding layer formed on the electrode pad; an upper metal bonding layer formed on the lower metal bonding layer and having a post shape of a predetermined height; and a conductive bump formed on the upper metal bonding layer, and a solder bump covers at least partially the surface of the upper metal bonding layer. An insulating layer for electrode reconfiguration is formed around the electrode pad on the substrate, and the insulating layer has a predetermined thickness to prevent the penetration of α particles from the solder bump. The semiconductor package may further comprise an oxidation preventing layer between the solder bump and the upper metal bonding layer. In accordance with the present invention, there is realized the flip chip semiconductor package which improves the adhesive strength of the solder bump and which more improves the reliability in the flip chip bump structure of fine pitches.

15 Claims, 10 Drawing Sheets

[Figure 1]
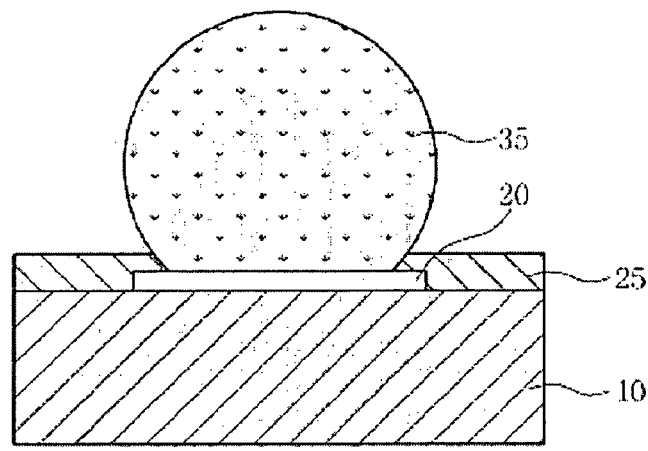
[Figure 2]
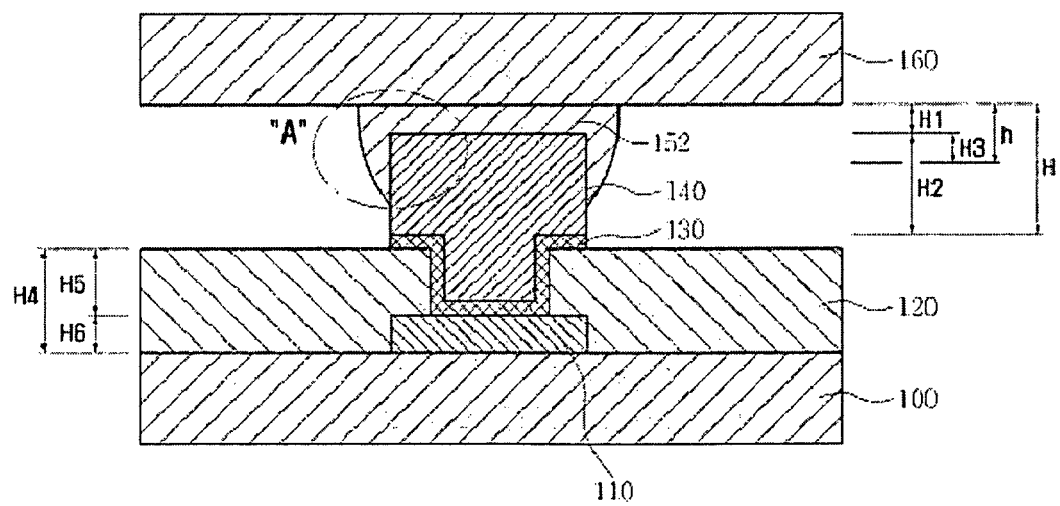

[Figure 3]
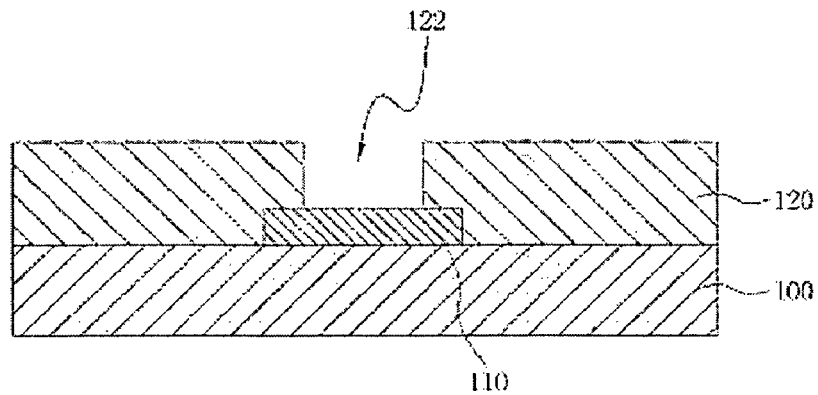
[Figure 4]
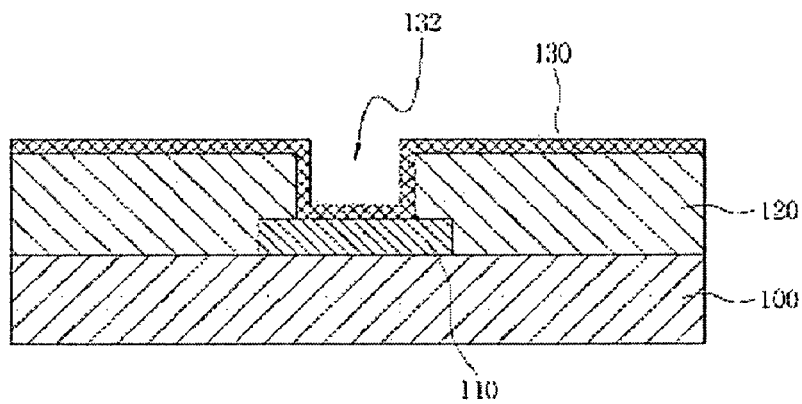
[Figure 5]
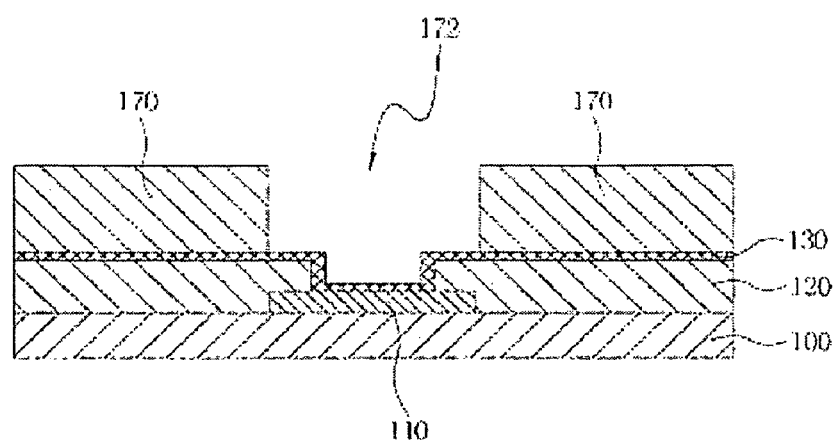
[Figure 6]

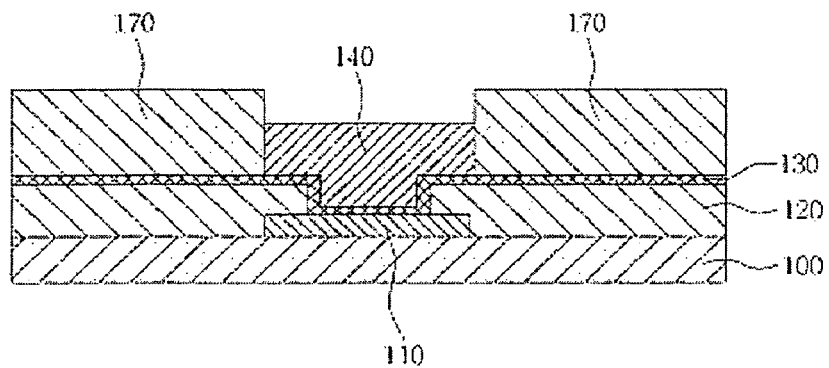
[Figure 7]
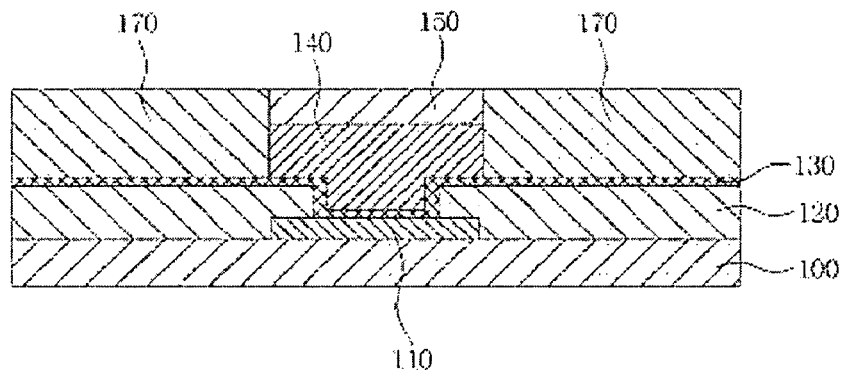
[Figure 8]
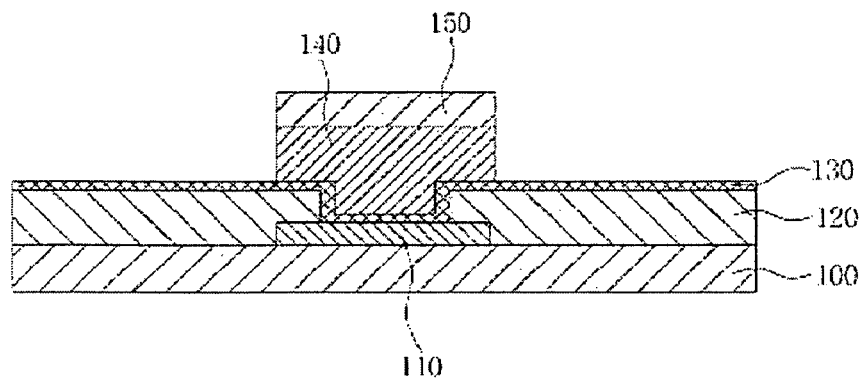

[Figure 9]
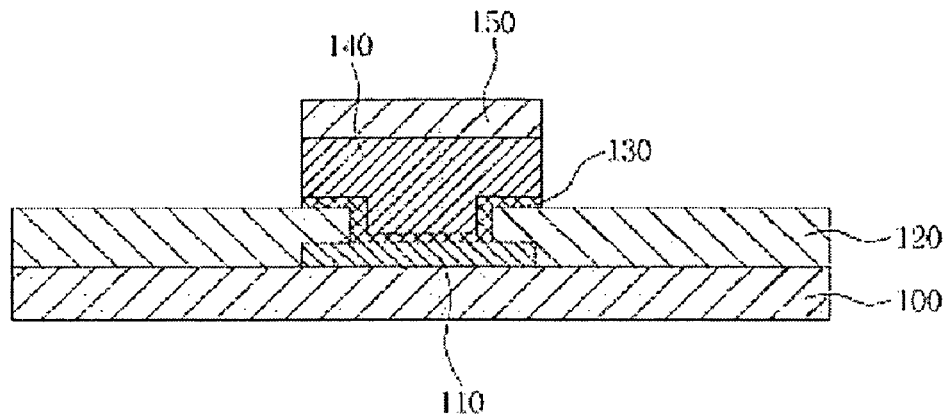
[Figure 10]
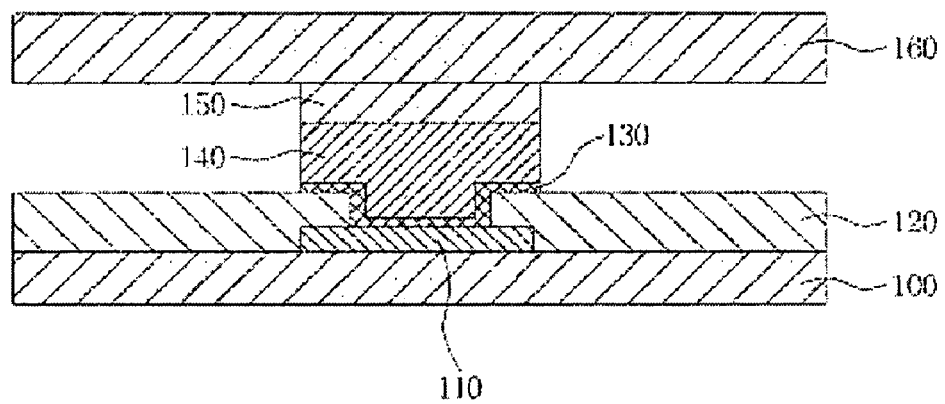
[Figure 11]
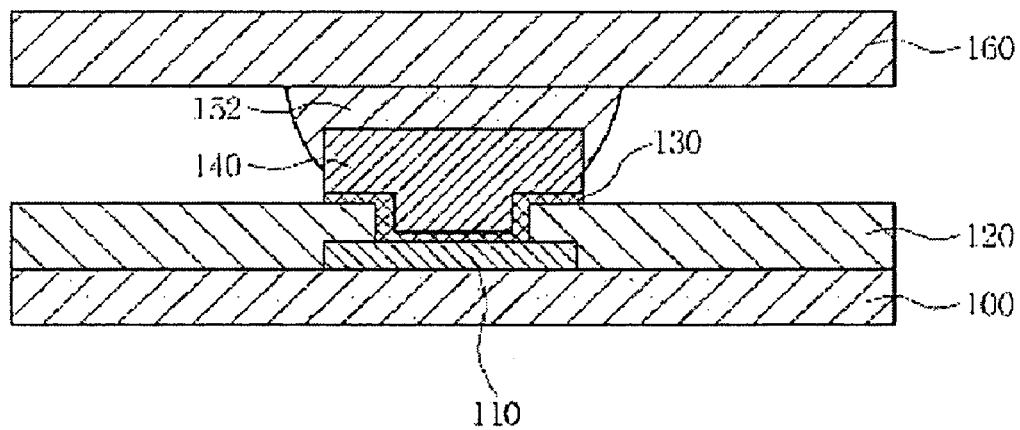

[Figure 12]
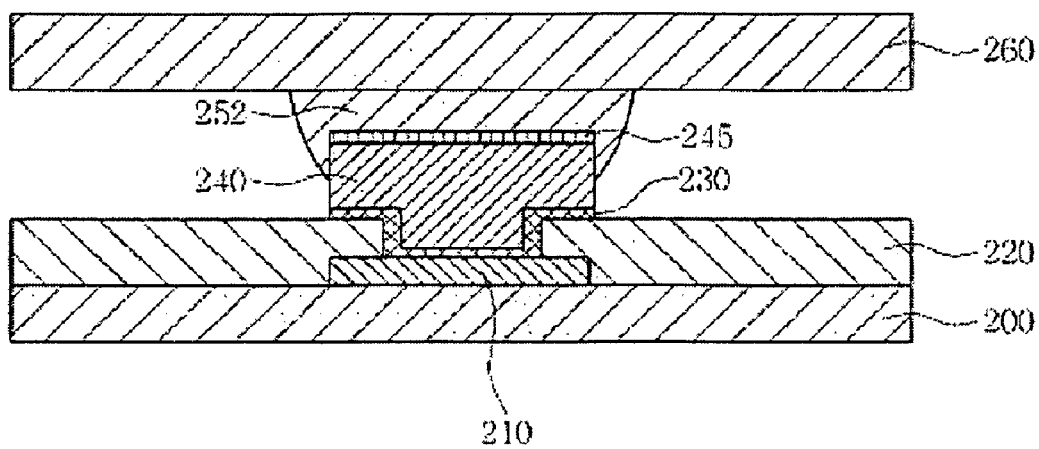
[Figure 13]
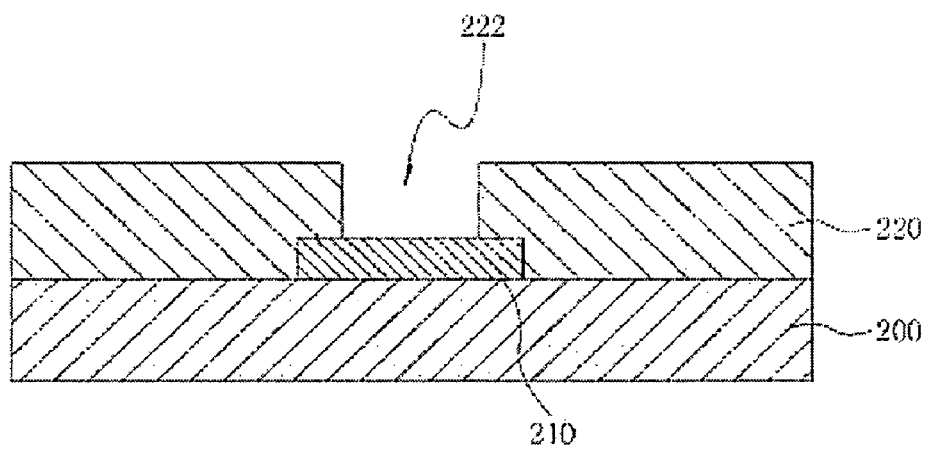

[Figure 14]
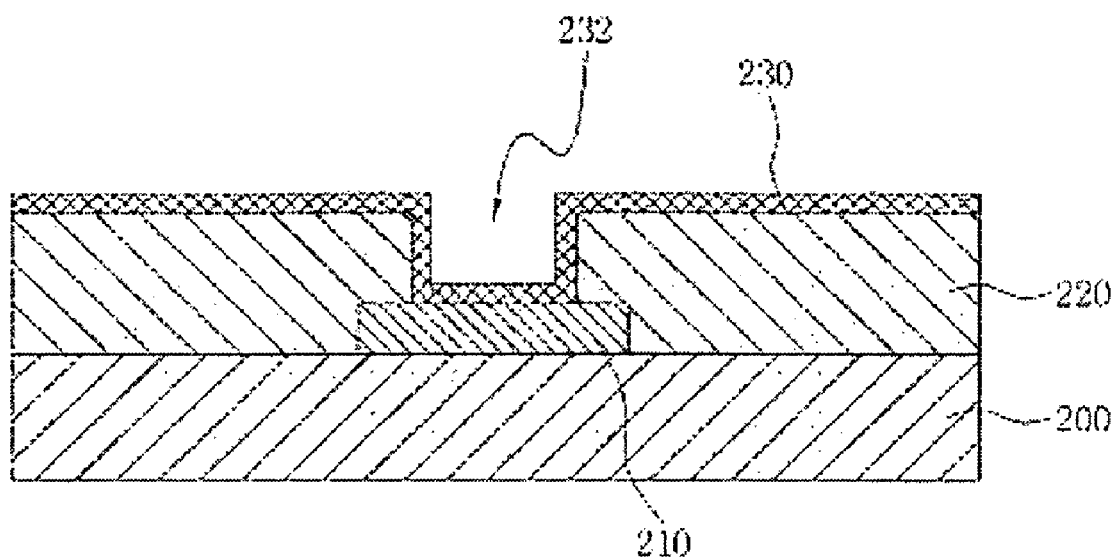

[Figure 15]
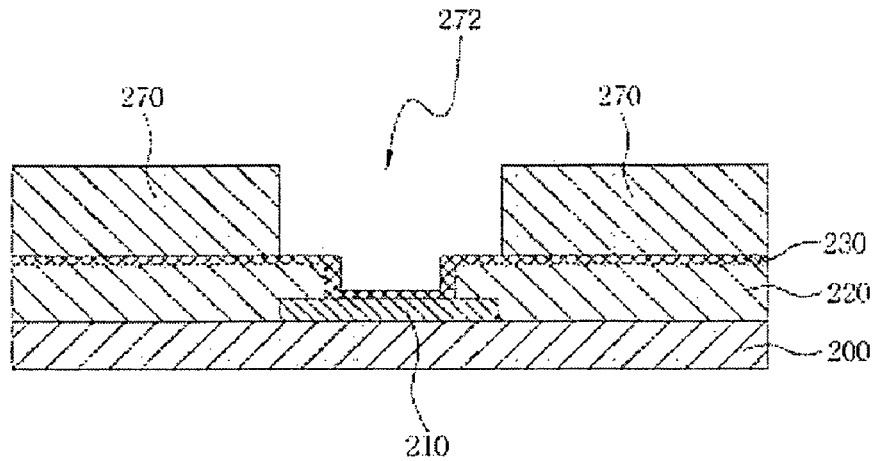
[Figure 16]
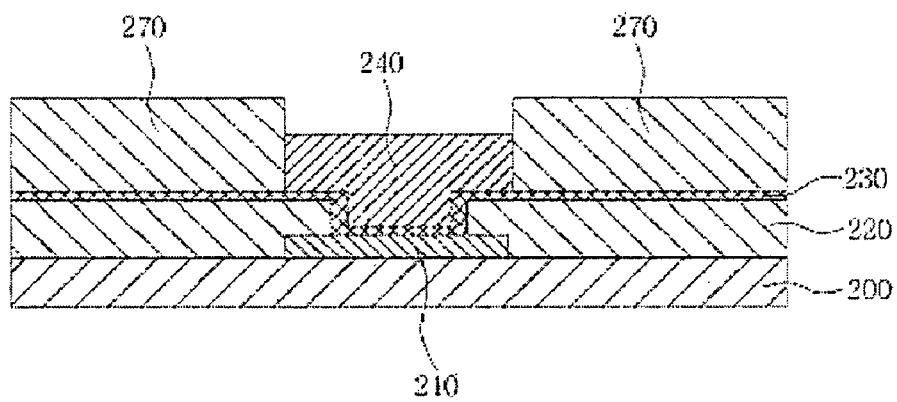
[Figure 17]
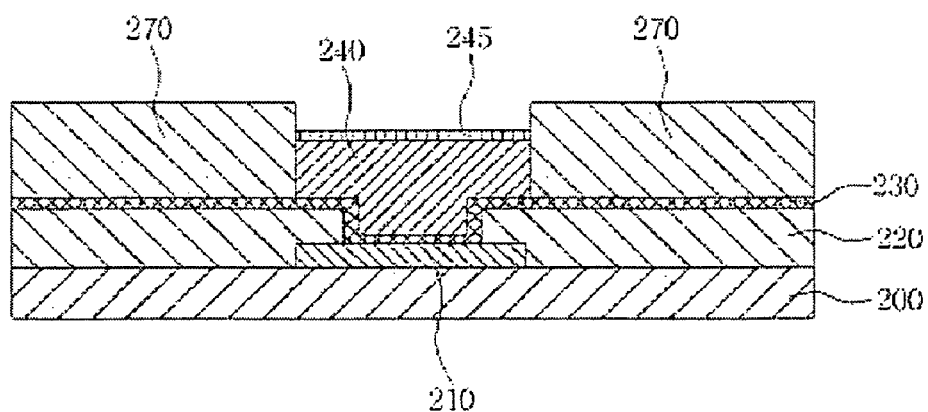

【Figure 18】
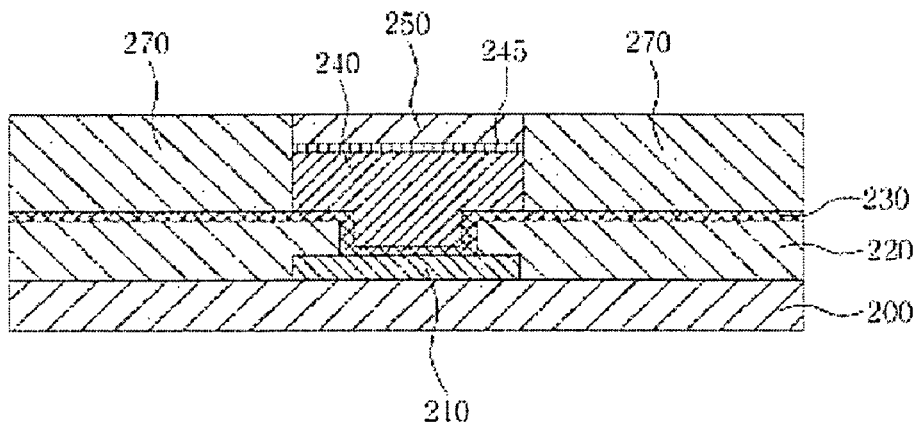
【Figure 19】
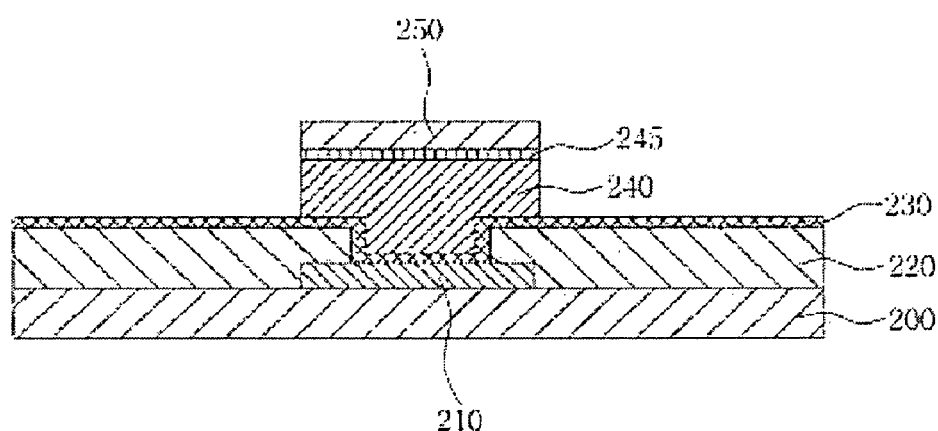
【Figure 20】
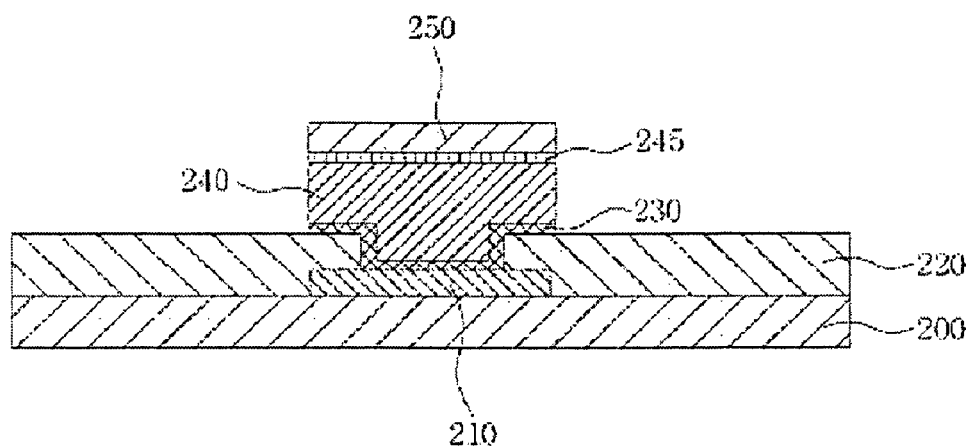
【Figure 21】

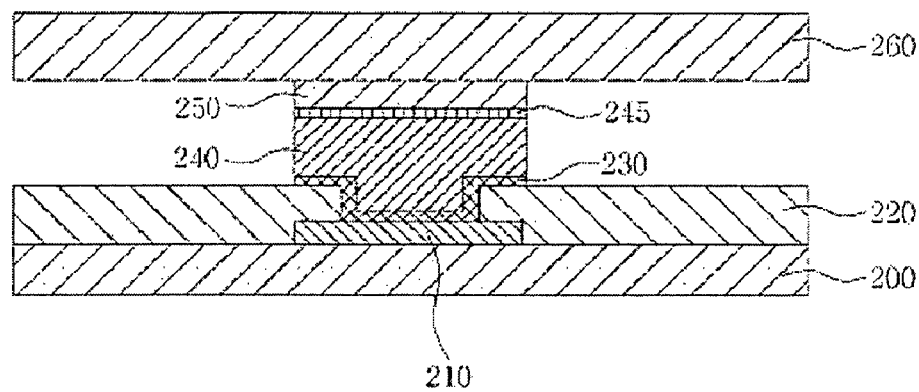
[Figure 22]
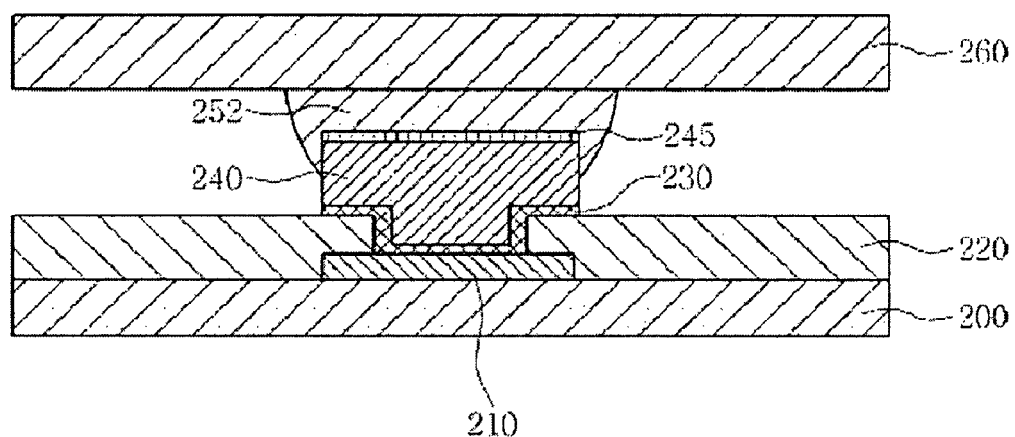

[Figure 23]
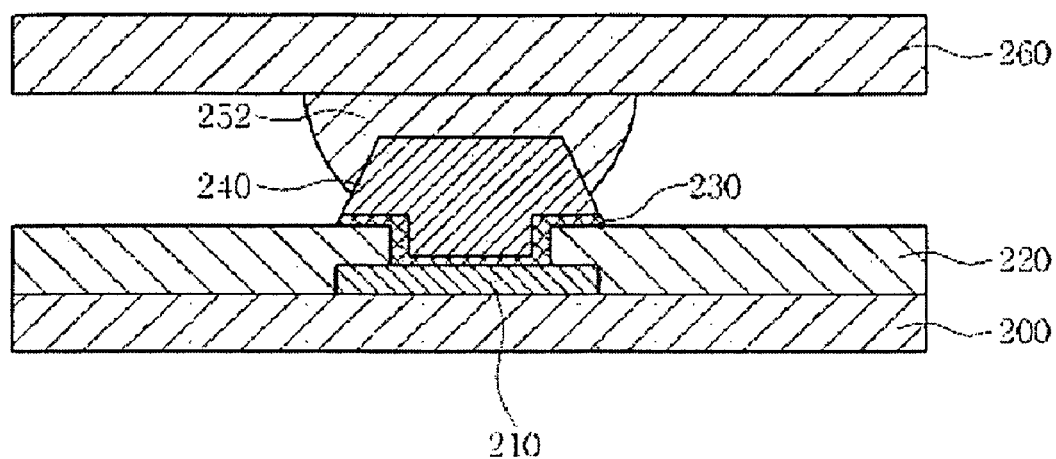

FLIP CHIP SEMICONDUCTOR PACKAGE AND FABRICATION METHOD THEREOF

CROSS-REFERENCE TO RELATED APPLICATIONS

This application is a U.S. National Phase patent application of PCT International Application No. PCT/KR2007/004199, filed Aug. 31, 2007, which claims priority of Korean Patent Applications 10-2006-0087464 filed on Sep. 11, 2006, the entire contents of which are hereby incorporated by reference.

BACKGROUND OF THE INVENTION

The present invention relates to a semiconductor package and, more particularly, to a flip chip semiconductor package which includes a bonding layer of a post shape under a solder bump.

BACKGROUND ART

As personal computers, portable phones, personal information terminals and electronic products have become small, light and been functionalized, data processing capacity has greatly increased. In accordance with this tendency, a wafer level chip scale package to be very close to the size of a semiconductor chip is regarded in semiconductor packages.

Generally, in the wafer level chip scale package, a wafer is packaged and cut after a wafer fabrication process. As a result, a process of the wafer level chip scale package is much simpler than that of a general packaging process through die bonding, wire bonding and molding processes. Further, the wafer level chip scale package provides an advantage of forming solder bumps of all chips on a single wafer at once. Further, the wafer level chip scale package is capable of testing an operation of each chip on the wafer, thereby incurring less fabrication costs, compared to conventional general packages.

FIG. 1 is a sectional view illustrating an example for explaining a conventional wafer level chip scale package. Referring to FIG. 1, a conductive electrode pad 20, such as aluminum, is formed on a silicon substrate 10 and is partially exposed by a protection layer 25 for protecting the substrate 10. A solder bump 35 is attached to the exposed electrode pad 20. Accordingly, the wafer level chip scale package is electrically connected to a board through the solder bump 35.

However, in the conventional semiconductor package, the adhesive strength of the solder bump is not good, so that an electrical characteristic deteriorates. Therefore, a semiconductor package needs to have a new structure to improve the adhesive strength of the solder bump.

DISCLOSURE

Technical Problem

The present invention has been made to solve the above problems, and it is an object of the present invention to provide a semiconductor package which has a new structure to improve the adhesive strength of a solder bump.

It is another object of the present invention to provide a semiconductor package which improves an electrical characteristic and, in particular, improves reliability of a flip chip bonding package of fine pitches.

Technical Solution

In accordance with the present invention, the above and other objects can be accomplished by a flip chip semiconductor package described below.

According to an aspect of the present invention, there is provided a flip chip semiconductor package comprising: an electrode pad formed on a semiconductor substrate; a lower metal bonding layer formed on the electrode pad; an upper metal bonding layer formed on the lower metal bonding layer and having a post shape of a predetermined height; and a solder bump formed on the upper metal bonding layer, and the upper metal bonding layer penetrates into the solder bump at a predetermined depth, so that the solder bump covers at least partially the upper metal bonding layer.

The upper metal bonding layer may be formed so that a lower width is narrower than an upper width and may be formed in a cylindrical post shape, a square post shape, or a frustum shape having a trapezoid section in which the width becomes progressively narrower relative to the width of the base of the frustum shape portion of the upper metal bonding layer.

Preferably, the lower metal bonding layer may be formed to have a stepped level, so that at least a part of the upper metal bonding layer penetrates into and contact with the stepped level part of the lower metal bonding layer.

Preferably, the upper metal bonding layer may penetrate to the depth of 0.01 to 50 μm. Preferably, the thickness of the upper metal bonding layer from the solder bump to the lower metal bonding layer may be at least 55 μm or more. Preferably, the thickness of the lower metal bonding layer may be within the range of 0.1 to 100 μm.

The upper metal bonding layer may be formed of any one or more materials selected from copper, copper alloy, nickel, nickel alloy, vanadium, vanadium alloy, aluminum, aluminum alloy, gold, gold alloy, cobalt, cobalt alloy, manganese, and manganese alloy.

The lower metal bonding layer may be formed of any one or more materials selected from titanium, titanium alloy, chrome, chrome alloy, copper, copper alloy, nickel, nickel alloy, gold, gold alloy, aluminum, aluminum alloy, vanadium, vanadium alloy, palladium, and palladium alloy.

Preferably, the thickness of the solder bump may be within the range of 10 to 1000 μm.

The solder bump may be formed of any one or more materials selected from Sn/Ag, Sn/Cu, Sn/Zn, Sn/Zn/Bi, Sn/Zn/Al, Sn/Ag/Al, Sn/Ag/Cu, Sn/Ag/Bi, Sn/Ag/Bi/In, high lead, and eutectic lead.

The flip chip semiconductor package may further comprise an oxidation preventing layer between the solder bump and the upper metal bonding layer, and the oxidation preventing layer may be formed of any one material selected from the oxidation prevention improving materials, such as Au, Ni and others. Preferably, the thickness of the oxidation preventing layer may be within the range of 0.05 to 100 μm.

According to another aspect of the present invention, there is provided a flip chip semiconductor package comprising: an electrode pad formed on a semiconductor substrate; an insulating layer formed on the semiconductor substrate and exposing a part of the electrode pad; a lower metal bonding layer formed on the exposed part of the electrode pad; an upper metal bonding layer formed on the lower metal bonding layer and having a post shape of a predetermined height; a solder bump formed on the upper metal bonding layer; and a semiconductor chip electrically connected on the solder bump, and the upper metal bonding layer penetrates into the solder bump at H3(0.01 to 50 μm).

Preferably, a lower part of the upper metal bonding layer may penetrate into the insulating layer at H5(1 to 100 μm). The flip chip semiconductor package may further comprise an oxidation preventing layer between the solder bump and the upper metal bonding layer.

According to another aspect of the present invention, there is provide a method of fabricating a flip chip semiconductor package, comprising: forming an electrode pad on a semiconductor substrate; forming a lower metal bonding layer on the electrode pad; forming an upper metal bonding layer having a post shape of a predetermined height on the lower metal bonding layer; and forming a solder bump on the upper metal bonding layer, and the upper metal bonding layer penetrates into the solder bump to a first depth.

The method of fabricating a flip chip semiconductor package may further comprise forming an oxidation preventing layer on the upper metal bonding layer; and forming an insulating layer on the semiconductor substrate so that a part of the electrode pad is exposed.

Advantageous Effects

In accordance with the present invention, the adhesive strength of the solder bump is improved, so that the structural stability of the semiconductor package is improved, the semiconductor device is prevented from being contaminated by a particles generated from the solder bump, and the reliability of the bump in the flip chip package of fine pitches is increasingly improved. Furthermore, the fabrication process is relatively simple to be easily applied to a conventional packaging line, so that it is very favorable in productivity.

DESCRIPTION OF DRAWINGS

These and other aspects and advantages of the present invention will become apparent and more readily appreciated from the following description of the embodiments, taken in conjunction with the accompanying drawings, in which:

FIG. 1 is a sectional view of a conventional semiconductor package;

FIG. 2 is a sectional view of a semiconductor package according to an embodiment of the present invention;

FIGS. 3 through 11 are sectional views illustrating, by steps, a process of fabricating the semiconductor package according to the embodiment of the present invention;

FIG. 12 is a sectional view of a semiconductor package according to another embodiment of the present invention;

FIGS. 13 through 22 are sectional views illustrating, by steps, a process of fabricating the semiconductor package according to the embodiment of the present invention; and FIG. 23 is a sectional view of a semiconductor package according to another embodiment of the present invention.

BEST MODE

Mode for Invention

Hereinafter, embodiments of the present invention will be described in detail with reference to the accompanying drawings.

FIG. 2 is a sectional view of a semiconductor package according to an embodiment of the present invention. As illustrated, an electrode pad 110 is formed on a semiconductor substrate 100, a lower metal bonding layer 130 and an upper metal bonding layer 140 are sequentially formed on the electrode pad 110, and a solder bump 152 is formed on the upper metal bonding layer 140. A semiconductor chip 160 is mounted on one end of the solder bump 152.

The upper metal bonding layer 140 is formed in a post shape and extended upward. As illustrated in part "A" of FIG. 2, a part of the upper metal bonding layer 140 penetrates into the solder bump 152 to a predetermined depth H3 and thus, the vertical thickness h of the solder bump 152 is substantially reduced to H1.

The penetration depth of the upper metal bonding layer 140 can be determined by controlling an amount of solder, and the substantial thickness H1 of the solder bump 152 may vary accordingly. The structure in that the upper metal bonding layer penetrates into the solder bump much more improves the reliability of the bonding between the upper metal bonding layer and the solder bump. The penetration depth of the upper metal bonding layer is proper within the range of 0.01 to 50 μm. When the penetration depth is under 0.01 μm, it is difficult to improve the adhesive strength, and when the penetration depth is above 50 μm, the thickness of an exposed portion of the upper metal bonding layer reduces, and further, the contamination of the substrate increases by a particles from the solder bump.

A lower part of the upper metal bonding layer 140 is narrow than an upper part thereof in width and contacts with the lower metal bonding layer 130. The lower part of the upper metal bonding layer 140 penetrates down lower than the surface of an insulating layer 120, through a stepped part of the lower metal bonding layer 130.

The insulating layer 120 is an insulating film for the reconfiguration of the electrode pad 110 formed on the semiconductor substrate 100 and has a predetermined thickness H4. The thickness H4 of the insulating layer 120 is equal to sum of a penetration depth H5 of the lower metal bonding layer 130 and the upper metal bonding layer 140 on the electrode pad, and a thickness H6 of the electrode pad.

Preferably, the thickness H4 of the insulating layer 120 may be within a proper range to prevent the a particles from the solder bump from penetrating into a device on the substrate. Although a penetration distance of the a particles may vary depending on a kind of a material used for the insulating layer, preferably, the insulating layer may be formed to the thickness of 0.1 to 100 μm.

The upper metal bonding layer 140 includes a lower region penetrating into the insulating layer 120 and having the height H5 (1 to 100 μm), and an upper region protruding above the insulating layer 120 and having the height H2. The upper region and the lower region are different from each other in width. The upper region contacts with the solder bump 150 and the lower region contacts with the lower metal bonding layer 130.

Preferably, the thickness of the upper metal bonding layer 140 penetrating into the solder bump 152 from the top of the lower metal bonding layer 130 may be determined by considering the influence of the a particles generated in the solder bump on electronic devices formed on the chip. The height H2 of the upper metal bonding layer is proper within the range being at least above 55 μm.

A process for fabricating the semiconductor package according to the embodiment of FIG. 2 will be described by each fabrication step.

Referring to FIG. 3, an electrode pad 110 is formed on the top surface of a semiconductor substrate 100, and an insulating layer 120 is formed on the electrode pad 110. The insulating layer 120 and the electrode pad are formed by reconfiguration, and a part of the insulating layer 120 is open to allow the top surface of the electrode pad 110 to be exposed to the outside. The thickness of the insulating layer 120 needs to be properly controlled to prevent a device from being contaminated by a particles from a solder bump which is subsequently formed.

The electrode pad 110 is an electrical path to be connected to electronic circuits formed in a semiconductor chip and corresponds to a region where a solder bump is formed by flip chip bonding.

A metal bonding layer to form a solder bump is formed in an opening part 122 of the insulating layer 120 on the electrode pad 110. As illustrated in FIG. 4, a lower metal bonding layer 130 as a first metal bonding layer is formed on the insulating layer 120 and the electrode pad 110. The lower metal bonding layer corresponds to an under bump metal (UBM) layer to obtain the adhesive strength between the electrode pad and an upper metal bonding layer.

The lower metal bonding layer 130 may be formed by a thin-film forming method, using any one or more materials selected from titanium, titanium alloy, chrome, chrome alloy, copper, copper alloy, nickel, nickel alloy, gold, gold alloy, aluminum, aluminum alloy, vanadium, vanadium alloy, palladium, and palladium alloy. Preferably, the thickness of the lower metal bonding layer may be within the range of 0.1 to 20 μm.

The lower metal bonding layer 130 is formed to have a stepped level from the top surface of the insulating layer 120 to the electrode pad 110. A first opening part 132 of a predetermined width is formed in the middle of the lower metal bonding layer 130.

After the lower metal bonding layer 130 is formed, the top surface of the lower metal bonding layer 130 is coated with a photoresist 170, to secure a region to form an upper metal bonding layer as a second metal bonding layer. The photoresist 170 is selectively etched to form a second opening part 172 to partially expose the region where the electrode pad 110 is positioned, as illustrated in FIG. 5. The width of the second opening part 172 is greater than that of the first opening part 132.

As illustrated in FIG. 6, an upper metal bonding layer 140 is formed on the second opening part 172. The upper metal bonding layer 140 is formed of a material having the excellent adhesive strength between the lower metal bonding layer 130 and the solder bump. The upper metal bonding layer 140 may be formed by using any one or more materials selected from copper, copper alloy, nickel, nickel alloy, vanadium, vanadium alloy, aluminum, aluminum alloy, gold, gold alloy, cobalt, cobalt alloy, manganese, and manganese alloy. In a preferred embodiment of the present invention, the upper metal bonding layer 140 is formed of copper.

The lower metal bonding layer 130 and the upper metal bonding layer 140 may be formed by a method, for example, PVD, CVD, thermal evaporation, electroplating, electroless plating, or screen printing.

Subsequently, as illustrated in FIG. 7, a solder bump 150 is formed on the upper metal bonding layer 140. The solder bump 150 may be formed by using any one or more materials selected from Sn/Ag, Sn/Cu, Sn/Zn, Sn/Zn/Bi, Sn/Zn/Al, Sn/Ag/Al, Sn/Ag/Cu, Sn/Ag/Bi, Sn/Ag/Bi/In, high lead, and eutectic lead. The proper thickness of the solder bump 150 may be within the range of 10 to 1000 μm.

The solder bump may be formed by a method, for example, electroplating, electroless plating, thermal evaporation, ball attach/placement, screen printing, or solder jet.

After a conductive bump (metal bonding layer and solder bump) is formed, the photoresist 170 is removed as illustrated in FIG. 8 and the lower metal bonding layer 130 being present in the other region than the conductive bump is removed as illustrated in FIG. 9.

A structure of the substrate on which the upper metal bonding layer and the solder bump are formed is completed through flip chip bonding. In this process, a part of the solder bump is allowed to cover the upper metal bonding layer 140, to more improve the adhesive strength at the bonding interface. In this case, the solder bump may be reflowed to cover at least 50% or more of the surface of the upper metal bonding layer.

FIG. 12 is a sectional view of a semiconductor package according to another embodiment of the present invention. Unlike the embodiment of FIG. 2, an oxidation preventing layer 245 is additionally included between a solder bump 252 and an upper metal bonding layer 240.

The oxidation preventing layer 245 is to prevent the oxidation of the upper metal bonding layer 240. For the oxidation preventing layer 245, a thin film formed of any one of the oxidation prevention improving materials, such as Au, Ni and others, is formed on the upper metal bonding layer 240 before the solder bump is formed.

The oxidation preventing layer 245 prevents the oxidation of the upper metal bonding layer 240 and accordingly prevents the deterioration of the adhesive strength between the upper metal bonding layer 240 and the solder bump 252. Since the purpose of the oxidation preventing layer 245 is to prevent the oxidation of the upper metal bonding layer 240, preferably, the oxidation preventing layer 245 may be formed not to be too thick and the proper thickness thereof may be within the range of 0.05 to 10 μm.

A process of fabricating the semiconductor package according to the embodiment of FIG. 12 will be described by each fabrication step.

Referring to FIG. 13, an electrode pad 210 is formed on the top surface of a semiconductor substrate 200, and an insulating layer 220 is formed on the electrode pad 210. An opening part 222 is formed by opening a part of the insulating layer 220, to expose the top surface of the electrode pad 210 to the outside.

The opening part 222 is for a metal bonding layer to form a solder bump. As illustrated in FIG. 14, a lower metal bonding layer 230 is formed on the insulating layer 220 and the electrode pad 210.

The lower metal bonding layer 230 is formed to have a stepped level from the top surface of the insulating layer 220 to the electrode pad 210. A first opening part 232 of a predetermined width is formed in the middle of the lower metal bonding layer 230.

After the lower metal bonding layer 230 is formed, the top surface of the lower metal bonding layer 230 is coated with a photoresist 270, to secure a region to form an upper metal bonding layer as another metal bonding layer. The photoresist 270 is selectively etched to form a second opening part 272 to partially expose the region where the electrode pad 210 is positioned, as illustrated in FIG. 15. The width of the second opening part 272 is greater than that of the first opening part 232.

As illustrated in FIG. 16, an upper metal bonding layer 240 is formed on the second opening part 272. The upper metal bonding layer 240 is formed by using copper as a material having the excellent adhesive strength between the lower metal bonding layer 230 and a solder bump.

An oxidation preventing layer 245 is formed to prevent the oxidation of copper on the upper metal bonding layer 240, as illustrated in FIG. 17. Subsequently, as illustrated in FIG. 18, a solder bump 250 is formed on the upper metal bonding layer 240.

After a conductive bump (upper metal bonding layer and solder bump) is formed, the photoresist 270 is removed as illustrated in FIG. 19, and the lower metal bonding layer 230 being present in the other region than the conductive bump is removed as illustrated in FIG. 20. After the substrate on which the conductive bump is formed is bonded with another substrate 260, such as PCB, as illustrated in FIG. 21, the solder bump 250 is changed to be in a spherical shape through a reflow process as illustrated in FIG. 22. In this process, a part of the solder bump is to cover the upper metal bonding layer 240.

FIG. 23 is a sectional view of a semiconductor package according to another embodiment of the present invention. As illustrated, the upper metal bonding layer 240 has a frustum shape of a trapezoid section in which the width becomes progressively narrower relative to the width of the base of the frustum shape portion of the upper metal bonding layer. In this shape, it is easy for the solder bump to cover the surface of the upper metal bonding layer 240 partially, preferably, more than 50%, and more preferably, up to about 80%.

However, unlike the shape illustrated in FIG. 23, the upper metal bonding layer may be formed in a reverse-frustum shape having the section in which the width becomes progressively broader relative to the width of the base of the reverse-frustum shape portion of the upper metal bonding layer. In this case, the bonding strength between the solder bump and the upper metal bonding layer can be firmer.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

The invention claimed is:

1. A flip chip semiconductor package comprising:
an electrode pad formed on a semiconductor substrate;
an insulating layer formed on the semiconductor substrate and exposing a part of the electrode pad;
a lower metal bonding layer formed on an exposed part of the electrode pad;
an upper metal bonding layer formed on the lower metal bonding layer and having a post shape of a predetermined height;
a solder bump formed on the upper metal bonding layer; and
a substrate electrically connected on the solder bump,
wherein the solder bump covers an upper part of a side wall of the upper metal bonding layer, and the upper metal bonding layer penetrates into the solder bump to a depth of 0.01 to 50 μm,
wherein the upper metal bonding layer is formed from the lower metal bonding layer to the solder bump at the height being at least 55 μm or more such that an exposed portion of the upper metal bonding layer at a lower part of the sidewall of the upper metal bonding layer is 5 microns or more.

2. The flip chip semiconductor package according to claim 1, wherein the thickness of the insulating layer is within the range of 0.05 to 10 μm.

3. The flip chip semiconductor package according to claim 1, wherein the upper metal bonding layer is formed so that a lower width is narrower than an upper width.

4. The flip chip semiconductor package according to claim 1, wherein the lower metal bonding layer is formed to include a stepped level.

5. The flip chip semiconductor package according to claim 4, wherein at least a part of the upper metal bonding layer downward penetrates into and contacts with a part of the stepped level of the lower metal bonding layer.

6. The flip chip semiconductor package according to claim 1, wherein the upper metal bonding layer is formed of any one or more materials selected from copper, copper alloy, nickel, nickel alloy, vanadium, vanadium alloy, aluminum, aluminum alloy, gold, gold alloy, cobalt, cobalt alloy, manganese, and manganese alloy.

7. The flip chip semiconductor package according to claim 1, wherein the lower metal bonding layer is formed of any one or more materials selected from titanium, titanium alloy, chrome, chrome alloy, copper, copper alloy, nickel, nickel alloy, gold, gold alloy, aluminum, aluminum alloy, vanadium, vanadium alloy, palladium, and palladium alloy.

8. The flip chip semiconductor package according to claim 1, wherein the thickness of the solder bump is within the range of 10 to 1000 μm.

9. The flip chip semiconductor package according to claim 1, wherein the solder bump is formed of any one or more materials selected from Sn/Ag, Sn/Cu, Sn/Zn, Sn/Zn/Bi, Sn/Zn/Al , Sn/Ag/Al , Sn/Ag/Cu, Sn/Ag/Bi, Sn/Ag/Bi/In, high lead, and eutectic lead.

10. The flip chip semiconductor package according to claim 1, further comprising an oxidation preventing layer between the solder bump and the upper metal bonding layer.

11. The flip chip semiconductor package according to claim 10, wherein the oxidation preventing layer is formed of any one material selected from An or Ni.

12. The flip chip semiconductor package according to claim 10, wherein the thickness of the oxidation preventing layer is within the range of 0.05 to 10 μm.

13. The flip chip semiconductor package according to claim 1, wherein the solder bump covers at least 50% or more of the surface of the upper metal bonding layer.

14. The flip chip semiconductor package according to claim 1, wherein the vertical section of the upper metal bonding layer has a trapezoid shape in which the width becomes progressively narrower relative to the width of the base of a trapezoid shape portion.

15. The flip chip semiconductor package according to claim 1, wherein the solder bump contacts the upper part of the side wall of the upper metal bonding layer.

* * * * *